United States Patent
Park et al.

(10) Patent No.: US 7,983,082 B2
(45) Date of Patent: Jul. 19, 2011

(54) APPARATUS AND METHOD OF MULTI-BIT PROGRAMMING

(75) Inventors: Sung Chung Park, Daejeon (KR); Heeseok Eun, Seoul (KR); Seung-Hwan Song, Incheon (KR); Jun Jin Kong, Yongin-si (KR); Dong Hyuk Chae, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 557 days.

(21) Appl. No.: 12/081,453

(22) Filed: Apr. 16, 2008

(65) Prior Publication Data
US 2009/0091990 A1    Apr. 9, 2009

(30) Foreign Application Priority Data
Oct. 9, 2007 (KR) .................. 10-2007-0101500

(51) Int. Cl.
*G11C 16/06* (2006.01)
*G11C 16/10* (2006.01)
*G11C 16/12* (2006.01)
*G11C 16/34* (2006.01)

(52) U.S. Cl. ......... 365/185.09; 365/185.02; 365/185.03; 365/185.22; 365/185.24

(58) Field of Classification Search ............. 365/185.02, 365/185.03, 185.09, 185.22, 185.24
See application file for complete search history.

(56) References Cited

U.S. PATENT DOCUMENTS

| 6,522,580 | B2 * | 2/2003 | Chen et al. ............... 365/185.02 |
| 2004/0136220 | A1 | 7/2004 | Cohen |
| 2006/0120165 | A1 | 6/2006 | Hemink |
| 2006/0274583 | A1 | 12/2006 | Lutze |

FOREIGN PATENT DOCUMENTS

| JP | 2001-250390 | 9/2001 |
| JP | 2002-184191 | 6/2002 |
| JP | 2004-171747 | 6/2004 |
| KR | 1999-0066130 | 8/1999 |
| KR | 1020020057055 | 7/2002 |
| KR | 1020040052409 | 6/2004 |
| KR | 100719380 | 5/2007 |
| WO | WO 2004/112040 | 12/2004 |

OTHER PUBLICATIONS

International Search Report dated Dec. 30, 2008 for corresponding International Application No. PCT/KR2008/003193.

* cited by examiner

*Primary Examiner* — J. H. Hur
(74) *Attorney, Agent, or Firm* — Harness, Dickey & Pierce, P.L.C.

(57) ABSTRACT

A multi-bit programming apparatus may include a first control unit that may generates $2^N$ threshold voltage states based on a target bit error rate (BER) of each of the page programming operations, a second control unit that may assign any one of the threshold voltage states to the N-bit data, and a programming unit that may program the assigned threshold voltage state in each of the at least one multi-bit cell to program the N-bit data.

20 Claims, 13 Drawing Sheets

FIG. 4

| DATA | 11 | 10 | 00 | 01 |
|---|---|---|---|---|
| 1st PAGE | 1 | 1 | 0 | 0 |
| 2nd PAGE | 1 | 0 | 0 | 1 |

440
410
420
430
450
460

APPARATUS AND METHOD OF MULTI-BIT PROGRAMMING

PRIORITY STATEMENT

This application claims priority under 35 U.S.C. §119 to Korean Patent Application No. 10-2007-0101500, filed on Oct. 9, 2007, in the Korean Intellectual Property Office (KIPO), the entire contents of which are incorporated herein by reference.

BACKGROUND

1. Field

Example embodiments may relate to apparatuses and/or methods that may program data in memory devices. Additionally, example embodiments may relate to multi-bit (multi-level) programming apparatuses and/or methods that may program data in multi-level memory devices.

2. Description of Related Art

A single-level cell (SLC) memory device may store one bit of data in a single memory cell. The SLC memory may be referred to as a single-bit cell (SBC) memory. The SLC memory may store and read data of one bit at a voltage level which may be included in two distributions that may be divided by a threshold voltage level programmed in a memory cell.

For example, when a voltage level read from the memory cell is greater than 0.5V and less than 1.5V, it may be determined that the data stored in the memory cell has a logic value of "1". When the voltage level read from the memory cell is greater than 2.5V and less than 3.5V, it may be determined that the data stored in the memory cell has a logic value of "0". The data stored in the memory cell may be classified depending on the difference between cell currents and/or cell voltages during the reading operations.

A multi-level cell (MLC) memory device that may store data of two or more bits in a single memory cell may provide higher integration of memory. The MLC memory device may also be referred to as a multi-bit cell (MBC) memory. However, as the number of bits stored in the single memory cell increases, reliability may deteriorate and read-failure rate may increase. To store 'm' bits in a single memory cell, $2^m$ voltage level distributions may be required. But, since the voltage window for a memory cell may be limited, the difference in threshold voltage between adjacent bits may decrease as 'm' increases, which may cause the read-failure rate to increase. For this reason, it may be difficult to improve storage density using a MLC memory device.

Accordingly, MLC memory devices may be widely used and thus error correction codes (ECC) or error control codes, which may detect an error occurring during data storing and reading operations and may correct the detected error, may be actively used.

Example embodiments may provide new multi-level (multi-bit) programming apparatuses and methods which may reduce the complexity ECC implemented in hardware.

SUMMARY

Example embodiments may provide apparatuses and/or methods that may apply a new multi-level (multi-bit) programming scheme in a multi-level cell (MLC) memory device and may thereby reduce complexity occurring when error control codes (ECC) schemes are implemented in hardware.

Example embodiments may also provide apparatuses and/or methods that may reduce a maximum value of a bit error rate (BER) for each page.

Example embodiments also may provide apparatuses and/or methods that may equalize the BER for each page.

Example embodiments may also provide apparatuses and/or methods that may apply a new multi-level (multi-bit) programming scheme in an MLC memory device and thereby may optimize a distribution of a threshold voltage within a voltage window.

Example embodiments may also provide apparatuses and/or methods that may make all pages evenly reliable without performing a separate method for interleaving/deinterleaving data to be programmed.

According to example embodiments, a multi-bit programming apparatus may include: a first control unit that may generate 2N threshold voltage states based on a target bit error rate (BER) of each of the page programming operations; a second control unit that may assign any one of the threshold voltage states to the N-bit data; and a programming unit that may generate the assigned threshold voltage state in each of the at least one multi-bit cell to program the N-bit data.

According to example embodiments, a multi-bit programming method may include: generating 2N threshold voltage states based on a target bit error rate (BER) of each of the page programming operations; assigning any one of the threshold voltage states to the N-bit data; and generating the assigned threshold voltage state in each of the at least one multi-bit cell to program the N-bit data.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

FIG. 4 is a diagram illustrating an example used for describing the relevance between N-bit data programmed by the multi-bit programming apparatus of FIG. 1 and a page programming operation performed N times according to example embodiments.

DESCRIPTION OF EXAMPLE EMBODIMENTS

Figure 1:
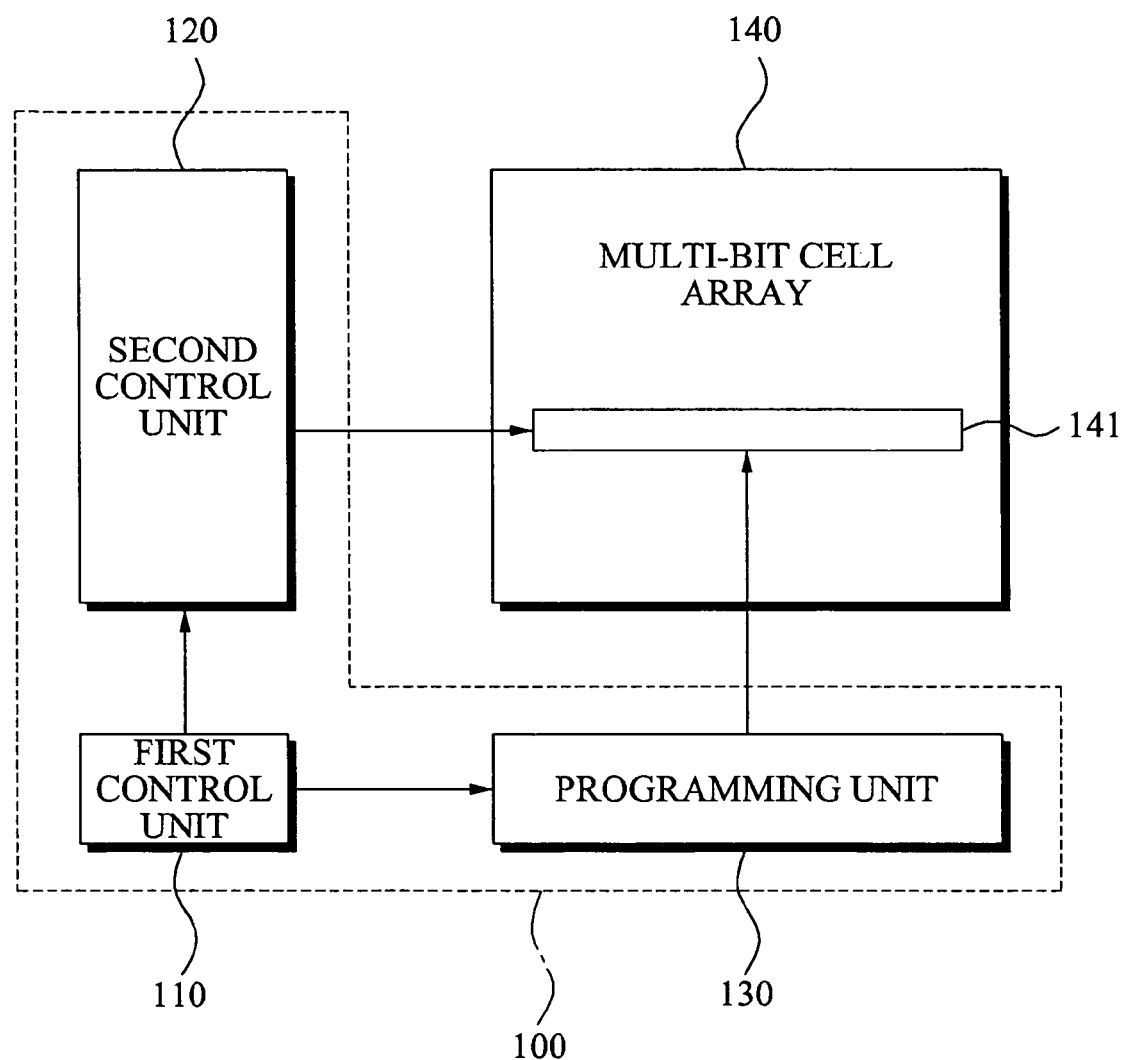
FIG. 1 is a diagram illustrating a multi-bit programming apparatus 100 according to example embodiments.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a diagram illustrating a multi-bit programming apparatus 100 according to example embodiments.

Referring to FIG. 1, a multi-bit programming apparatus 100 may include a first control unit 110, a second control unit 120, and a programming unit 130.

A multi-bit cell array 140 may include a plurality of multi-bit cells. Multi-bit cells simultaneously programmed in one page programming operation may be referred to as a page. According to example embodiments, the page 141 may be a plurality of multi-bit cells connected to a one word line. The one word line may be connected to a gate of each of the multi-bit cells within the page 141.

According example embodiments, a page programming operation with respect to the page 141 may be performed using a Fowler-Nordheim tunneling (F-N tunneling). In order to use the F-N tunneling, a high voltage may be applied to a word line connected to the page 141.

The multi-bit programming apparatus 100 may program N-bit data in each of the multi-bit cells within the page 141. The multi-bit programming apparatus 100 may perform a page programming operation N times, and thereby may program the N-bit data in each of the multi-bit cells. One page programming operation may correspond to one-bit data.

The first control unit 110 may generate 2N threshold voltage states based on a target bit error rate (BER) of each of the page programming operations. Threshold voltage states generated by the first control unit 110 may be logical and ideal threshold voltage states, and may be physically generated in each of the multi-bit cells by the programming unit 130.

The second control unit 120 may assign one of the logical threshold voltage states generated by the first control unit to the N-bit data. The N-bit data may generate $2^N$ different values. The threshold voltage states assigned to the N-bit data may correspond to the 2N different values.

The programming unit 130 may generate the threshold voltage states in each of the multi-bit cells within the page 141. The threshold voltage states generated by the programming unit 130 may be threshold voltage states assigned to the N-bit data to be programmed in each of the multi-bit cells within the page 141.

According to example embodiments, the programming unit 130 may perform a page programming operation N times, and thereby may generate the threshold voltage states assigned to each of the multi-bit cells within the page 141. Each of the page programming operations may include a plurality of unit programming operations, and each of the unit programming operations may use the F-N tunneling.

Figure 2:
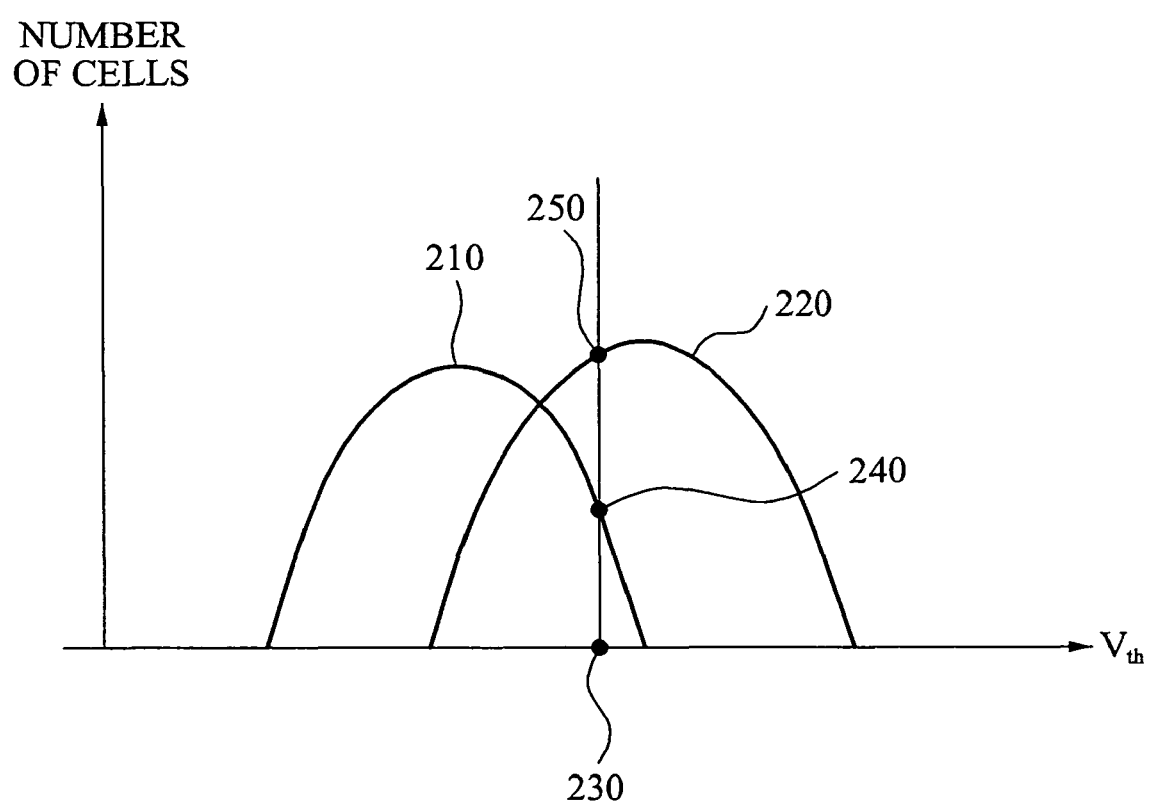
FIG. 2 is a graph illustrating an example of a process of determining, from a threshold voltage state generated by a programming unit of FIG. 1, data of each of multi-bit cells according to example embodiments.

FIG. 2 is a graph illustrating an example of a process of determining, from a threshold voltage state generated by a programming unit 130, data of each of multi-bit cells according to example embodiments.

Referring to FIG. 2, the transverse axis may denote threshold voltages of multi-bit cells and the vertical axis may denote a number of multi-bit cells corresponding to the threshold voltages.

As illustrated in FIG. 2, threshold voltage states may denote the threshold voltage states physically generated in the multi-bit cells within the page 141 of FIG. 1.

It may be assumed that the page 141 includes a relatively large number of multi-bit cells. In general, the page 141 may include 256, 512 or 1024 multi-bit cells.

A threshold voltage state 210 may correspond to data '1', and a threshold voltage state 220 may correspond to data '0'. The threshold voltage state 210 may denote a distribution of threshold voltages of multi-bit cells where the data '1' is programmed. The threshold voltage state 220 may denote a distribution of threshold voltages of multi-bit cells where the data '0' is programmed.

It may be statistically demonstrated that when the page 141 includes a relatively large number of the multi-bit cells, the threshold voltage state 210 may be considered as a probability of threshold voltage of the multi-bit cells where the data '1' is programmed.

Similarly, the threshold voltage state 220 may be considered as a probability of threshold voltage of the multi-bit cells where the data '0' is programmed.

When a threshold voltage of a first multi-bit cell has a value 230, a probability that data programmed in the first multi-bit cell will be '1' may be in proportion to a distribution 240. Additionally, a probability that data programmed in the first multi-bit cell will be '0' may be in proportion to a distribution 250.

Accordingly, when the threshold voltage of the first multi-bit cell has the value 230, the probability that the data programmed in the first multi-bit cell will be '0' may be greater than the probability that the data will be '1'.

In general, in determining data programmed in the multi-bit cell, it is well known that when the data is determined based on a threshold voltage state having the greatest probability with respect to a given threshold voltage, an error occurrence rate may be easier to suppress.

Figure 3:
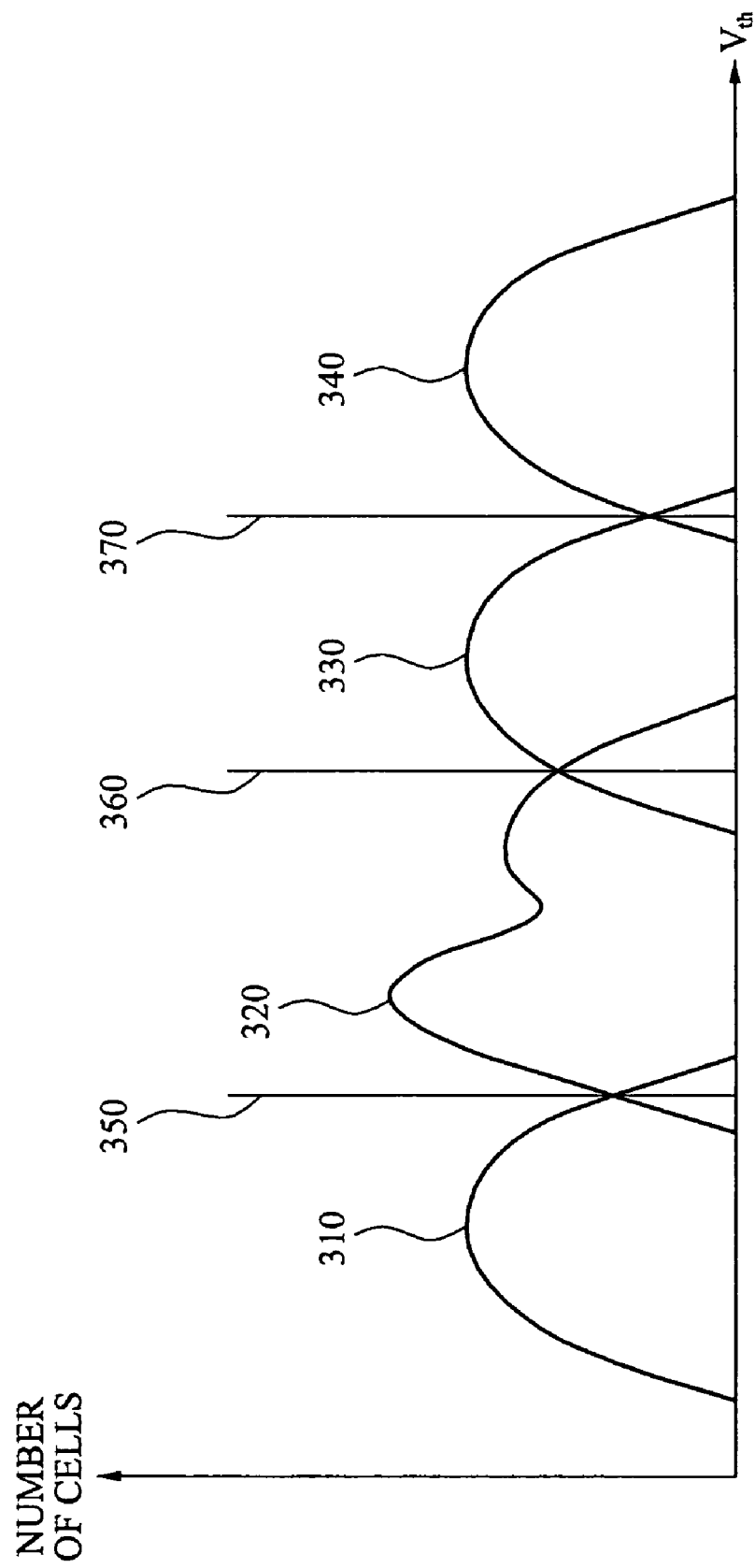
FIG. 3 is a graph illustrating another example of a process of determining, from a threshold voltage state generated by the programming unit of FIG. 1, data of each of multi-bit cells according to example embodiments.

FIG. 3 is a graph illustrating another example of a process of determining, from a threshold voltage state generated by the programming unit 130 of FIG. 1, data of each of multi-bit cells according to example embodiments.

Referring to FIG. 3, the transverse axis may denote threshold voltages of multi-bit cells, and the vertical axis may denote a number of multi-bit cells corresponding to the threshold voltages.

As illustrated in FIG. 3, threshold voltage states may denote the threshold voltage states which may be physically generated in the multi-bit cells within the page 141.

The threshold voltage states illustrated in FIG. 3 may correspond to probabilities of threshold voltages of the data programmed in the multi-bit cells within the page 141 in the same manner as described above.

A threshold voltage state 310 may correspond to a probability of threshold voltages of data '11'.

A threshold voltage state 320 may correspond to a probability of threshold voltages of data '10'.

A threshold voltage state 330 may correspond to a probability of threshold voltages of data '00'.

A threshold voltage state 340 may correspond to a probability of threshold voltages of data '01'.

When a threshold voltage of a second multi-bit cell is less than a reference voltage 350, the second multi-bit cell may have the greatest probability of being included in the threshold voltage state 310 and thus data programmed in the second multi-bit cell may be determined as '11'.

When the threshold voltage of the second multi-bit cell is greater than the reference voltage 350 and less than a reference voltage 360, the second multi-bit cell may have the greatest probability of being included in the threshold voltage state 320 and thus data programmed in the second multi-bit cell may be determined as '10'.

When the threshold voltage of the second multi-bit cell is greater than the reference voltage 360 and less than a reference voltage 370, the second multi-bit cell may have the greatest probability of being included in the threshold voltage state 330 and thus data programmed in the second multi-bit cell may be determined as '00'.

When the threshold voltage of the second multi-bit cell is greater than the reference voltage 370, the second multi-bit cell may have the greatest probability of being included in the threshold voltage state 340 and thus data programmed in the second multi-bit cell may be determined as '01'.

A probability that the data being programmed as '11' is determined as '10', or that the data being programmed as '10' is determined as '11' may be in proportion to an overlapped area between the threshold voltage state 310 and the threshold voltage state 320. An event where the programmed data and the determined data are different from each other may be referred to as a transition, and a probability that the transition occurs may be referred to as a transition probability.

The threshold voltage probability or the transition probability of the multi-bit cells as described above may be applied regardless of shapes of distribution of the threshold voltage.

As illustrated in FIG. 3, the threshold voltage state 320 may have a shape different from those of the threshold voltage state 310 or the threshold voltage state 330. However, despite the differences in their shape, the threshold voltage state 320 may correspond to a probability of the threshold voltage of the multi-bit cells where the data '10' is programmed, and the threshold voltage state 310 may correspond to a probability of the threshold voltage of the multi-bit cells where the data '11' is programmed.

Also, the transition probability may be in proportion to an overlapped area between the threshold voltage states regardless of shapes of threshold voltage.

Figure 4:
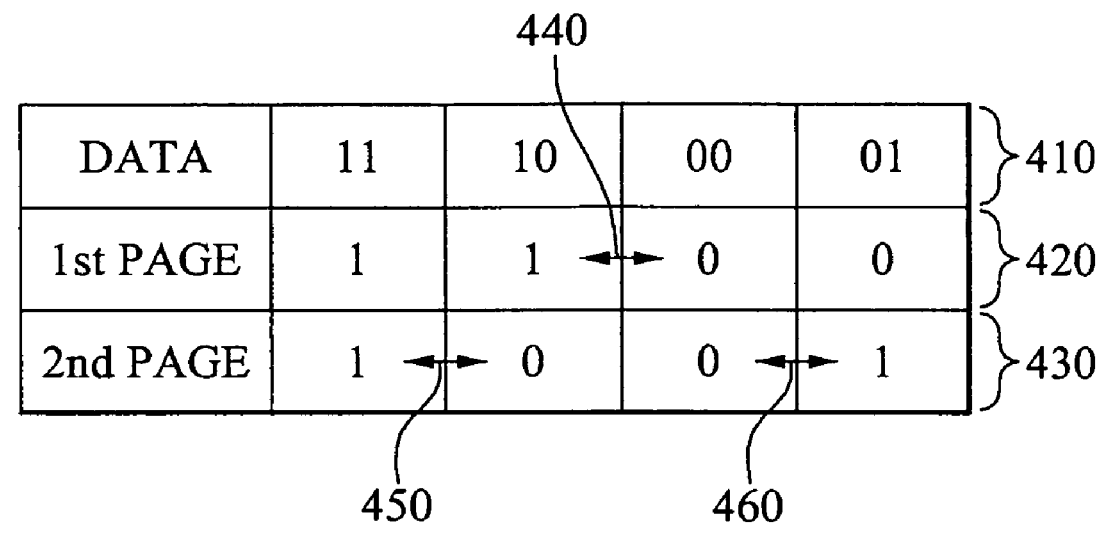

FIG. 4 is a diagram illustrating an example used for describing the relevance between N-bit data programmed by the multi-bit programming apparatus 100 of FIG. 1 and a page programming operation performed N times according to example embodiments.

In FIG. 4, N may be 2.

Data 410 may be 2-bit data programmed in the page 141.

First page data 420 may be one-bit data which may correspond to a first page programming operation. Second page data 430 may be one-bit data which may correspond to a second page programming operation.

The data 410 may be programmed in each of the multi-bit cells within the page 141 by a combination of the first page data 420 and the second page data 430.

Referring to FIGS. 3 and 4, '11' within the data 410 may correspond to the threshold voltage state 310, and '10' within the data 410 may correspond to the threshold voltage state 320. Similarly, '00' within the data 410 may correspond to the threshold voltage state 330, and '01' within the data 410 may correspond to the threshold voltage state 340.

The reference voltage 350 may correspond to a transition 450, the reference voltage 360 may correspond to a transition 440, and the reference voltage 370 may correspond to a transition 460.

A possible transition number of the first page data 420 and the second page data 430 may be determined, based on a code mapping scheme in which the second control unit 120 may assign one of the threshold voltage states in N-bit data.

In general, a bit error rate (BER) of each of the page programming operations or the page data may be proportional to the possible transition number.

According example embodiments, in generating logical threshold voltage states, the first control unit of the multi-bit programming apparatus 100 may adjust a distance between the threshold voltage states based on the target BER of each of the page programming operations.

Figure 5:
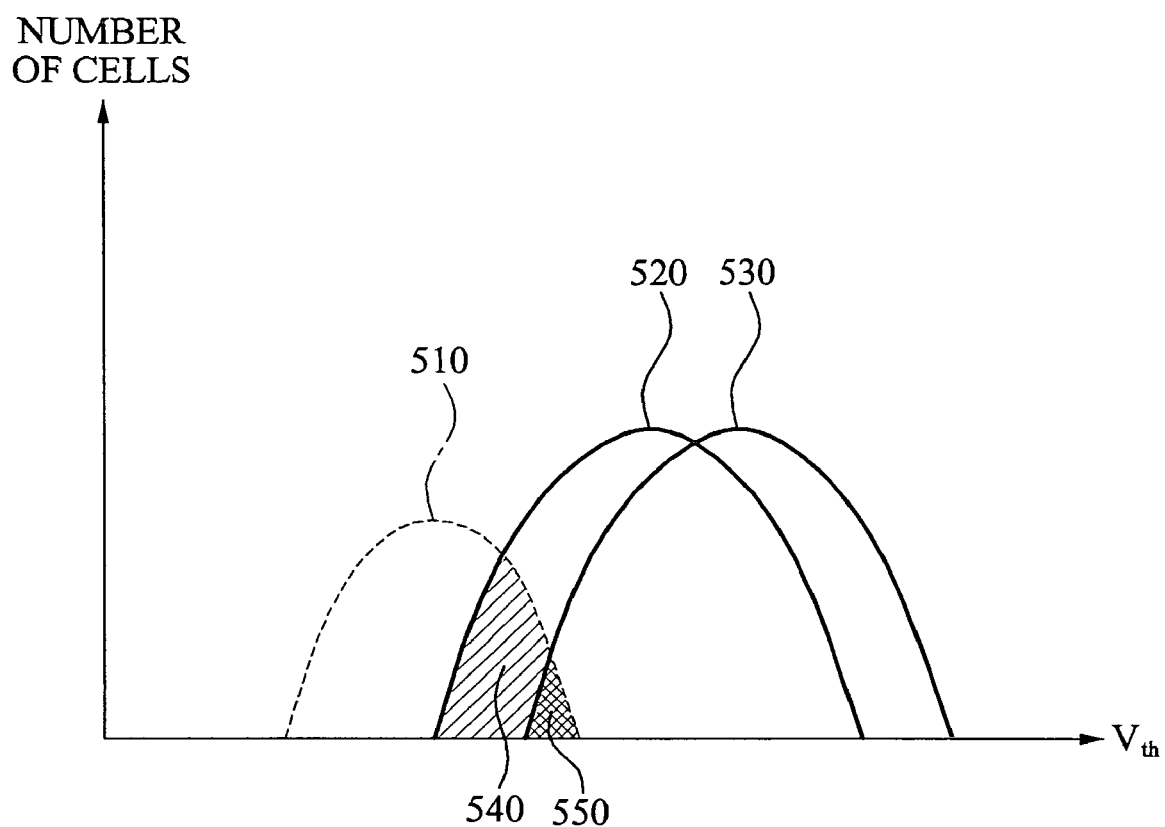
FIG. 5 is a graph illustrating an example of threshold voltage states generated by a first control unit of FIG. 1 according to example embodiments.

FIG. 5 is a graph illustrating an example of threshold voltage states generated by the first control unit 110 of FIG. 1 according to example embodiments.

Referring to FIG. 5, a transverse axis may denote threshold voltages of the multi-bit cells, and a vertical axis may denote a number of multi-bit cells corresponding to the threshold voltages.

Threshold voltage states illustrated in FIG. 5 may correspond to a probability of threshold voltages of the data programmed in the multi-bit cells within the page 141 in the same manner as described above.

A threshold voltage state 510 may correspond to a probability of threshold voltages of data '1'.

Either a threshold voltage state 520 or a threshold voltage state 530 may correspond to a probability of threshold voltages of data '0'.

When the threshold voltage state 520 corresponds to the probability of threshold voltages of the data '0', a probability of a transition occurrence between the data '1' and the data '0' may be in proportion to a transition probability 540.

When the threshold voltage state 530 corresponds to the probability of the threshold voltage of the data '0', a probability of a transition occurrence between the data '1' and the data '0' may be in proportion to a transition probability 550.

When the threshold voltage state 510 corresponding to the data '1' is fixed, the first control unit 110 may select either the threshold voltage state 520 or the threshold voltage state 530, and may assign the selected threshold voltage state to a threshold voltage state corresponding to the probability of the threshold voltage of the data '0'.

In determining respective distances between the threshold voltage states, the first control unit 110 may be restricted by a voltage window of a multi-bit cell memory device.

Accordingly, when the BER needs to be reduced, the first control unit 110 may increase the distance between the corresponding threshold voltage states. Conversely, when the BER needs to be increased, the first control unit 110 may reduce the distance between the corresponding threshold voltage states.

In order to increase a number of bits of data stored in one multi-bit cell in a state where the voltage window of the multi-bit cell memory device is restricted, a reduction in the distance between the threshold voltage states may be required.

In order to reduce the error in determining data while increasing the number of bits of the data stored in the multi-bit cell, an error correction codes (ECC) scheme and the like may be used.

An ECC encoder and decoder may perform ECC encoding and decoding with respect to each of the page data. As the BER of each of the page data increases, complexity of the ECC encoder and decoder may increase so as to recover data without errors.

In general, the BER of each page of data may be in proportion to a possible transition number with respect to each of the page data.

Thus, according to example embodiments, the first control unit 110 may adjust a distance between the threshold voltage states based on the possible transition number with respect to each of the page data.

Since the complexity of the ECC encoder and decoder may increase with an increase in the BER of the page programming operation, when a BER of a page programming operation having a maximum BER decreases, the complexity of the ECC encoder and decoder may decrease.

According to example embodiments, respective BERs of the page programming operations may be evenly adjusted. The respective page data may be evenly reliable.

Figure 13:
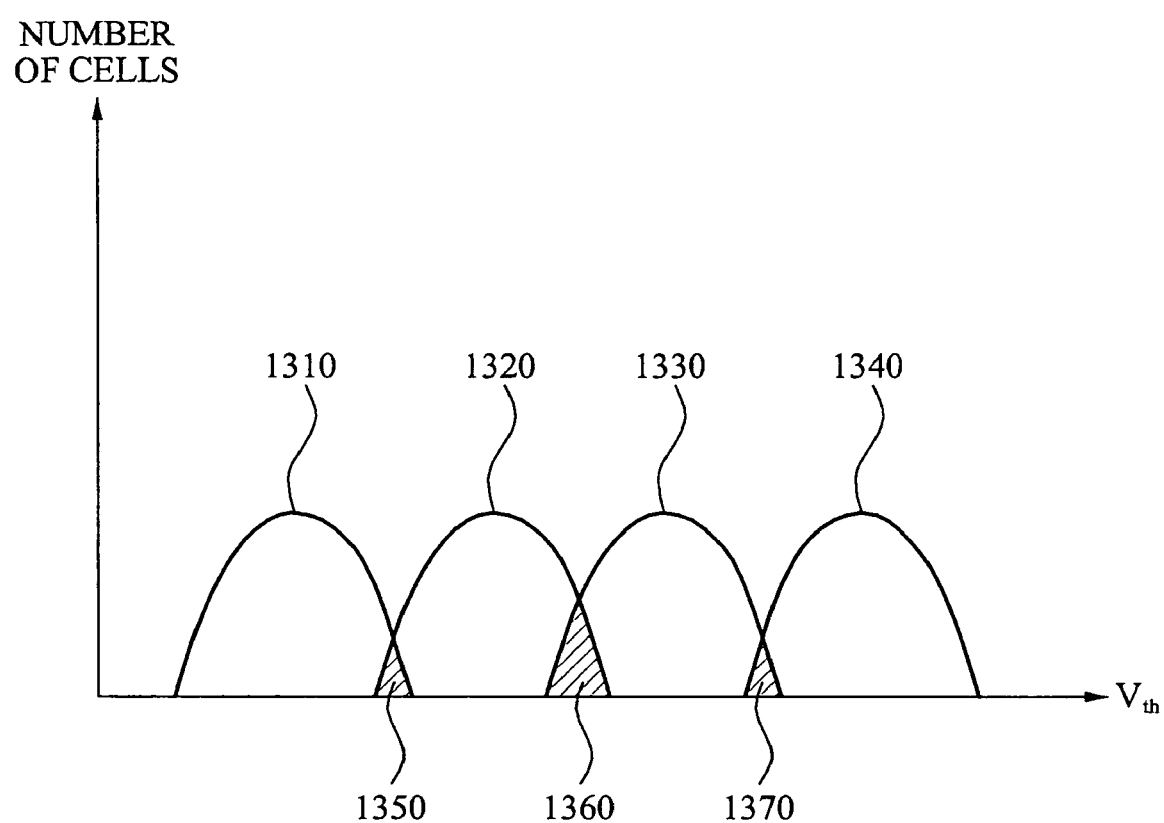
FIG. 13 is a graph illustrating an example of four threshold voltage states generated by the first control unit when N is 2 according to example embodiments.

FIG. 13 is a graph illustrating an example of four threshold voltage states which may be generated by the first control unit 110 of FIG. 1 when N is 2.

Referring to FIG. 13, a transverse axis may denote threshold voltages of multi-bit cells and a vertical axis may denote a number of multi-bit cells corresponding to the threshold voltages.

Threshold voltage states illustrated in FIG. 13 may correspond to a probability of threshold voltages of the data programmed in the multi-bit cells within the page 141 in the same manner as described above.

A threshold voltage state 1310 may correspond to a probability of threshold voltages of data '11'.

A threshold voltage state 1320 may correspond to a probability of threshold voltages of data '10'.

A threshold voltage state 1330 may correspond to a probability of threshold voltages of data '00'.

A threshold voltage state 1340 may correspond to a probability of threshold voltages of data '01'.

A transition probability 1350 may denote a probability of a transition occurrence between the data '11' and the data '10'.

A transition probability 1360 may denote a probability of a transition occurrence between the data '10' and the data '00'.

A transition probability 1370 may denote a probability of a transition occurrence between the data '00' and the data '01'.

Referring to FIGS. 13 and 4, the transition probability 1360 may correspond to the transition 440.

The transition probability 1350 may correspond to the transition 450, and the transition probability 1370 may correspond to the transition 460.

A BER of the first page data 420 may be in proportion to a possible transition number within the first page data 420. A BER of the second page data 430 may be in proportion to a possible transition number within the second page data 430.

Since the transition 440 may be possible within the first page data 420, the possible transition number may be '1', and since the transitions 450 and 460 may be possible within the second page data 430, the possible transition number may be '2'.

Since the possible transition number of the first page data 420 may be less than that of the second page data 430, a BER of the first page programming operation may be expected to be less than that of the second page programming operation.

Accordingly, the first control unit 110 may increase the BER of the first page programming operation, and may reduce the BER of the second page programming operation, so that the respective BER of the first and second page programming operations are evenly adjusted.

The first control unit 110 may increase the transition probability 1360, and may reduce the transition probabilities 1350 and 1370. The first control unit 110 may reduce a distance between the threshold voltage states 1320 and 1330, and may increase a distance between the threshold voltage states 1310 and 1320 and a distance between the threshold voltage states 1330 and 1340, and as a result the transition probability may be adjusted.

Figure 6:
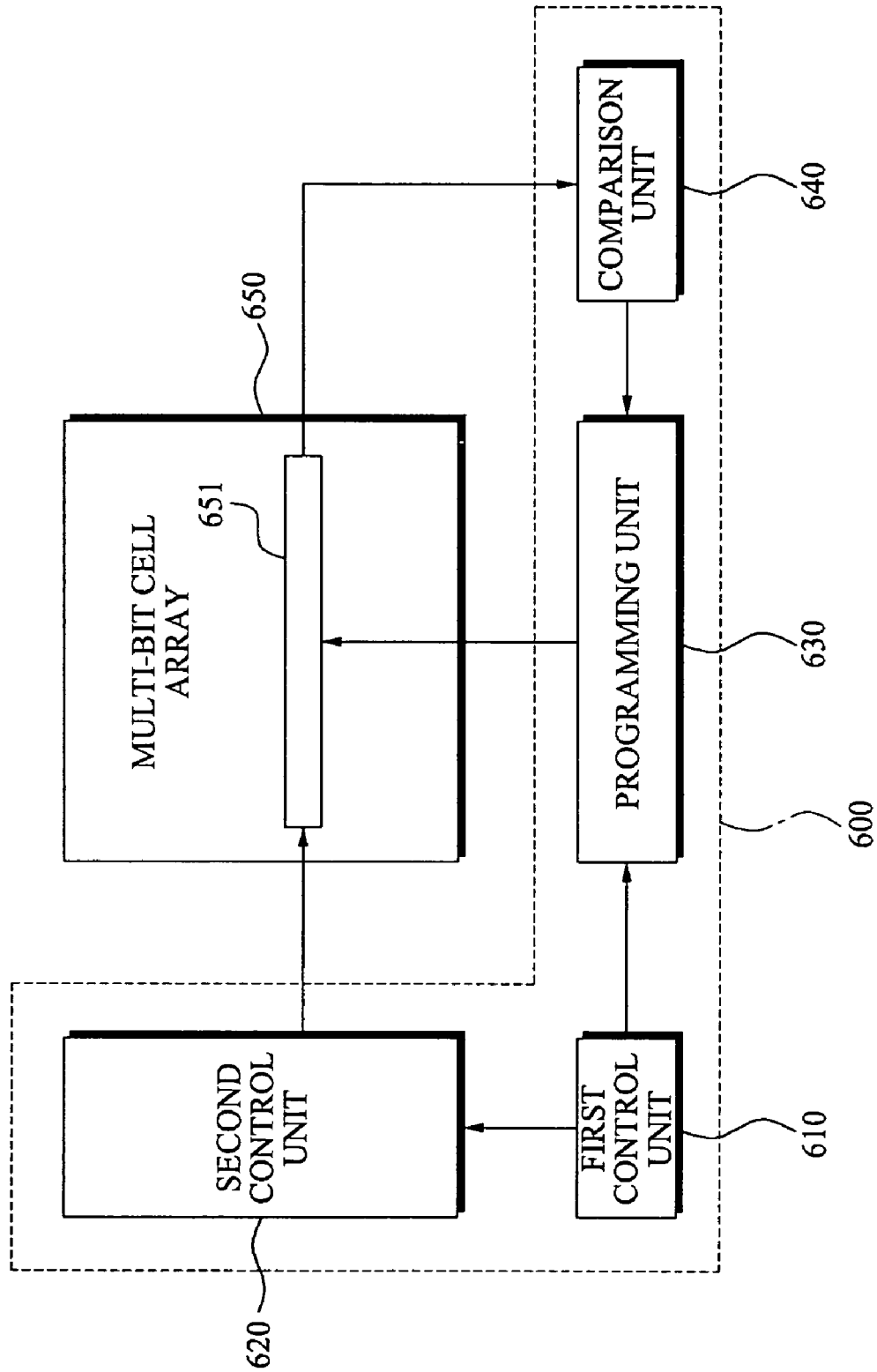
FIG. 6 is another diagram illustrating a multi-bit programming apparatus according to example embodiments.

FIG. 6 is a diagram illustrating a multi-bit programming apparatus 600 according to example embodiments.

Referring to FIG. 6, a multi-bit programming apparatus 600 may include a first control unit 610, a second control unit 620, a programming unit 630, and a comparison unit 640.

The first control unit 610 may generate logical threshold voltage states based on a target BER of each of page programming operations.

The second control unit 620 may assign one of the logical threshold voltage states in N-bit data.

The programming unit 630 may generate the assigned threshold voltage states in each of multi-bit cells within a page 651.

The page 651 may include a plurality of multi-bit cells which may be simultaneously programmed.

A multi-bit cell array 650 may include a plurality of pages.

The comparison unit 640 may detect a threshold voltage of each of the multi-bit cells within the page 651. The comparison unit 640 may output a comparison result which may be acquired by comparing the detected threshold voltage and a verification voltage. The programming unit 630 may generate the verification voltage for each of the assigned logical threshold states. The programming unit 630 may perform programming operations depending on the comparison result which may be acquired by comparing the detected threshold voltage and a verification voltage by the comparison unit 640.

The programming unit 630 may adjust a length of a programming time period depending on the outputted comparison result by the comparison unit 640.

A one-page programming operation may include a plurality of unit programming operations. Whenever each of the unit programming operations is finished, the comparison unit 640 may output corresponding comparison results with respect to each of the multi-bit cells, and the programming unit 630 may determine whether a subsequent unit programming operation is performed with respect to each of the multi-bit cells depending on the outputted comparison results.

The length of the programming time period may be increased with an increase in a number of programming operations with respect to one multi-bit cell.

It may be assumed that the unit programming operation may be an operation for increasing a threshold voltage of the multi-bit cell. When the threshold voltage of the first multi-bit cell is less than the verification voltage according to the comparison result of the comparison unit 640, the programming unit 630 may perform a subsequent unit programming operation with respect to the first multi-bit cell. When the threshold voltage of the second multi-bit cell is equal to or greater than the verification voltage according to the comparison result of the comparison unit 640, the programming unit 630 may not perform a subsequent unit programming operation with respect to the second multi-bit cell.

The first control unit 610 may adjust a verification voltage corresponding to each of the N-bit data to generate a threshold voltage state.

Figure 7:
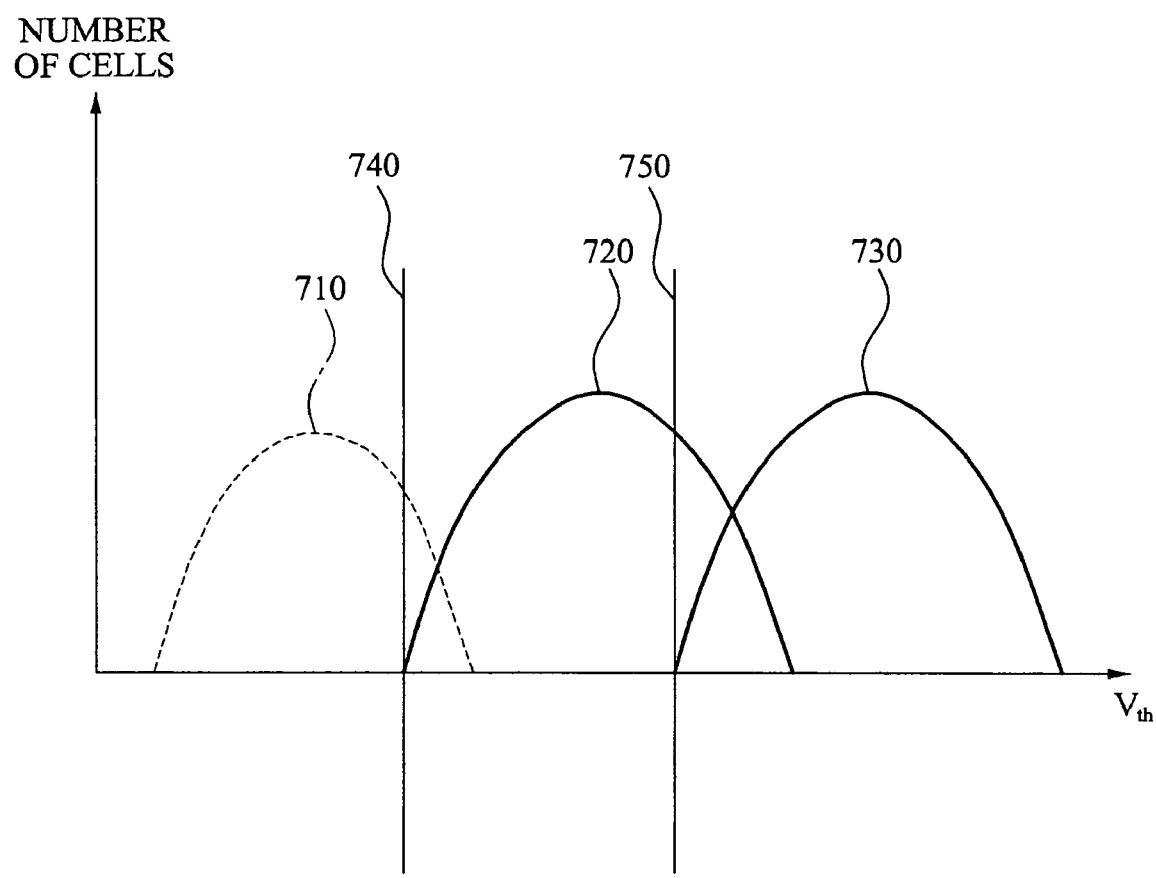
FIG. 7 is a graph illustrating a process where threshold voltage states are generated by varying a verification voltage using a first control unit of FIG. 6 according to example embodiments.

FIG. 7 is a graph illustrating a process where threshold voltage states may be generated by varying a verification voltage using the first control unit 610 of FIG. 6.

Referring to FIG. 7, a transverse axis may denote threshold voltages of multi-bit cells and a vertical axis may denote a number of multi-bit cells corresponding to the threshold voltages.

The threshold voltage states illustrated in FIG. 7 may correspond to a probability of threshold voltages of the data programmed in the multi-bit cells within the page 651 in the same manner as describe above.

A threshold voltage state 710 may correspond to a probability of threshold voltages of data '1'.

Either a threshold voltage state 720 or a threshold voltage state 730 may correspond to a probability of threshold voltages of data '0'.

When the first control unit 610 selects a voltage 740 as a verification voltage corresponding to the data '0', the threshold voltage state 720 may correspond to the probability of threshold voltages of the data '0'.

When the first control unit 610 selects a voltage 750 as the verification voltage corresponding to the data '0', the threshold voltage state 730 may correspond to the probability of threshold voltages of the data '0'.

The first control unit 610 may select the verification voltage corresponding to the data '0' as either the voltage 740 or the voltage 750, based on a transition probability between the data '1' and the data '0'.

Figure 8:
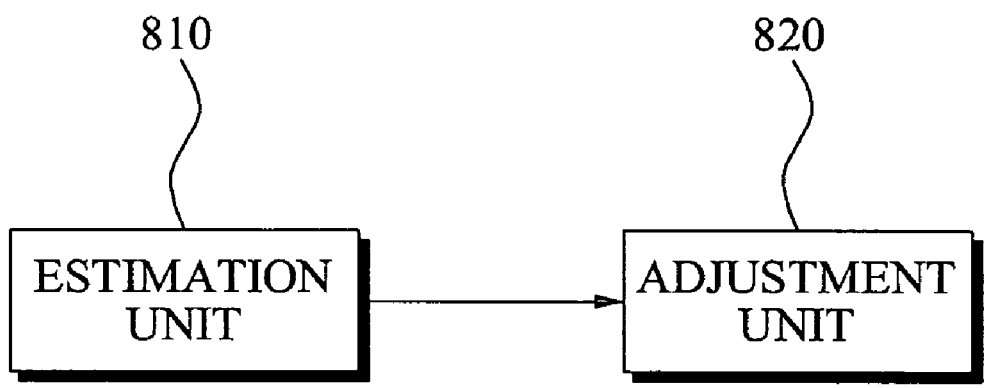
FIG. 8 is a diagram illustrating an example of the first control unit of the multi-bit programming apparatus of FIG. 1 according to example embodiments.

FIG. 8 is a diagram illustrating an example of the first control unit 110 of the multi-bit programming apparatus 100 of FIG. 1 according to example embodiments.

Referring to FIG. 8, the first control unit 110 may include an estimation unit 810 and an adjustment unit 820.

A threshold voltage generating process of the first control unit 110 may be performed the following manner.

First, the first control unit 110 may generate first threshold voltage states.

The estimation unit 810 may estimate a BER of each of page programming operations performed N times based on the first threshold voltage states.

The estimation unit 810 may estimate an overlapped area between the first threshold voltage states, and may calculate a transition probability between the N-bit data based on the estimated area.

The BER of each N page programming operations may be estimated based on a possible transition number of each of the N page data and a transition probability of each of possible transitions.

According to example embodiments, the estimation unit 810 may estimate that types of all first threshold voltage states are shown as identical parabolic shapes.

According to example embodiments, the estimation unit 810 may determine all transition probabilities of the possible transitions within one page data to be identical.

The adjustment unit 820 may adjust the first threshold voltage states to generate second threshold voltage states depending on comparison results between the BER of each of the estimated page programming operations and the target BER.

According to example embodiments, when the BER of each of the estimated page programming operations is less than the target BER, the adjustment unit 820 may adjust, from among the first threshold voltage states, threshold voltage states to be closer together associated with the estimated BER.

When the BER of each of the estimated page programming operations is greater than the target BER, the adjustment unit 820 may separate threshold voltage states associated with the estimated BER from each other by a relatively long distance, from among the first threshold voltage states.

When an estimated BER of a first page programming operation is less than the target BER, the adjustment unit 820 may adjust the distance to be reduced between threshold voltage states associated with a possible transition within the first page data, from among the first threshold voltage states. The adjustment unit 820 may generate the second threshold voltage states from the adjusted threshold voltage states.

When the estimated BER of the second page programming operation is greater than the target BER, the adjustment unit 820 may adjust the distance to be increased between threshold voltage states associated with a possible transition within the second page data, from among the first threshold voltage states.

According to example embodiments, the multi-bit programming unit 100 may measure a threshold voltage distribution of multi-bit cells after fabricating the multi-bit memory device and may thereby obtain a probability of the threshold voltage from the measured results.

According to example embodiments, the multi-bit programming unit 100 may flexibly adjust a threshold voltage of multi-bit cells after fabricating the multi-bit memory device and may thereby obtain even BER for each page.

Figure 9:
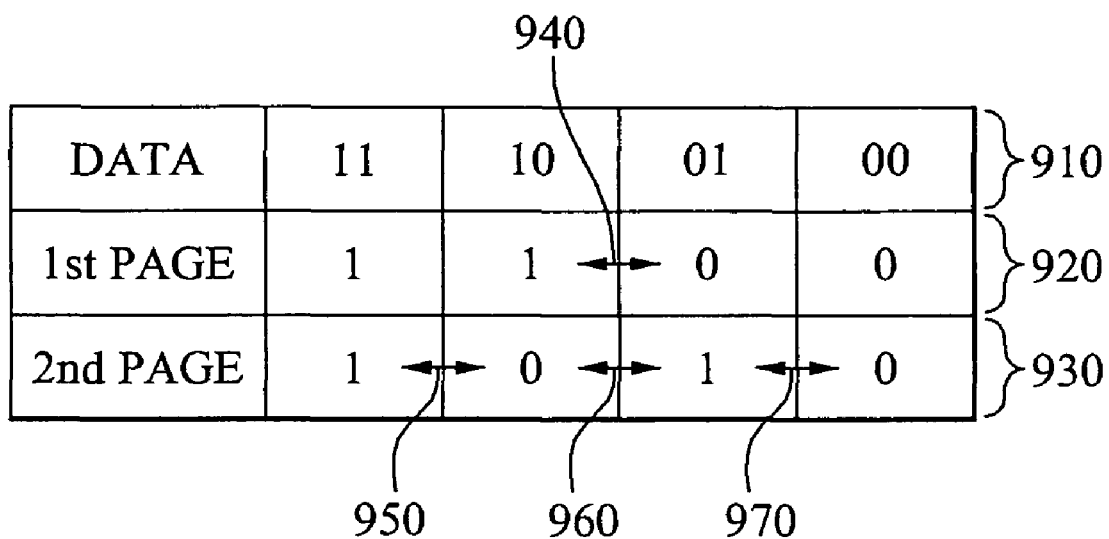
FIG. 9 is a diagram illustrating another example used for describing the relevance between N-bit data programmed by the multi-bit programming apparatus of FIG. 1 and a page programming operation performed N times according to example embodiments.

FIG. 9 is a diagram illustrating another example used for describing the relevance between N-bit data programmed by the multi-bit programming apparatus 100 of FIG. 1 and a N page programming operations according to example embodiments.

In FIG. 9, N may be 2.

Data 910 may be 2-bit data programmed in the page 141.

First page data 920 may be one-bit data which may correspond to a first page programming operation, and second page data 930 may be one-bit data which may correspond to a second page programming operation.

The data 910 may be programmed in each of multi-bit cells within the page 141 by a combination of the first page data 920 and the second page data 930.

Referring to FIGS. 3, 4, and 9, the data '11' from among the data 410 of FIG. 4 may correspond to the threshold voltage state 310, and the data '10' may correspond to the threshold voltage state 320.

The data '00' from among the data 410 may correspond to the threshold voltage state 330, and the data '01' may correspond to the threshold voltage state 340.

Data '11' from among the data 910 of FIG. 9 may correspond to the threshold voltage state 310, and data '10' may correspond to the threshold voltage state 320.

Data '01' from among the data 910 may correspond to the threshold voltage state 330, and data '00' may correspond to the threshold voltage state 340.

A possible transition from among the first page data 920 may be a transition 940.

Possible transitions from among the second page data 930 may be transitions 950, 960, and 970.

According to example embodiments, the second control unit 120 of the multi-bit programming apparatus 100 may employ either the code mapping scheme described in FIG. 4 or the code mapping scheme of FIG. 9.

According to the code mapping scheme of FIG. 4, a possible transition number within the second page data 430 may be '2', and a possible transition number within the first page data 420 may be '1'.

According to the code mapping scheme of FIG. 9, a possible transition number within the second page data 930 may be '3', and a possible transition number within the first page data 920 may be '1'.

The first control unit 110 may generate threshold voltage states based on the code mapping scheme which may be used by the second control unit 120.

Since a BER of each of the page data may be affected by the code mapping scheme used by the second control unit 120, when the first control unit 110 generates the threshold voltage states, taking the code mapping scheme into consideration may be required.

Figure 10:
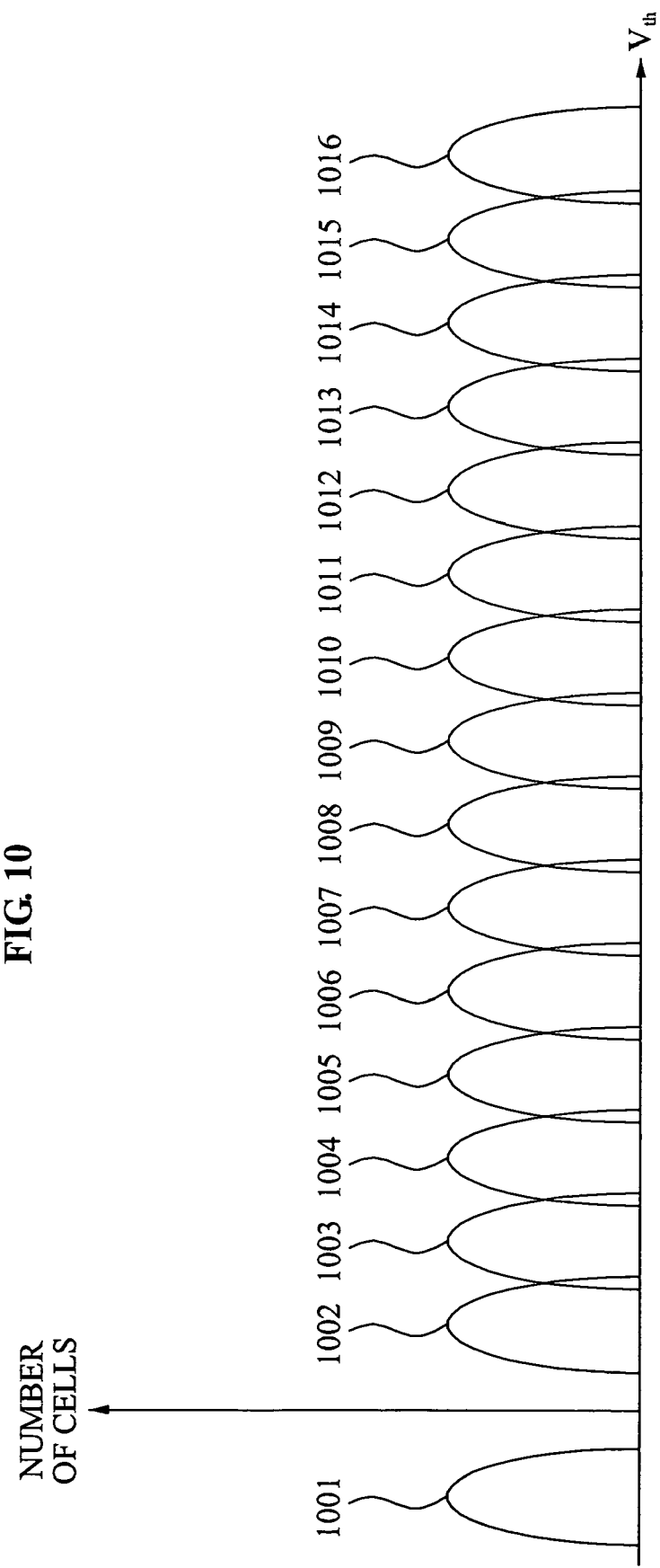
FIG. 10 is a graph illustrating an example of threshold voltage states generated by the first control unit of FIG. 1 when N is 4 according to example embodiments.

FIG. 10 is a graph illustrating an example of threshold voltage states generated by the first control unit 110 of FIG. 1 when N is 4 according to example embodiments.

Referring to FIG. 10, a transverse axis may denote threshold voltages of multi-bit cells and a vertical axis may denote a number of multi-bit cells corresponding to the threshold voltages.

Threshold voltage states 1001 to 1016 illustrated in FIG. 10 may correspond to a probability of threshold voltages of the data which may be programmed in the multi-bit cells within the page 141 in the same manner as described above.

For convenience of description, the threshold voltage states 1001 and 1002 may be assumed to be a state '0' and a state '1', respectively. In this manner, the threshold voltage states 1015 and 1016 may be assumed to be a state '14' and a state '15', respectively.

According to example embodiments, it may be assumed that shapes of all threshold voltage states 1001 to 1016 are the same.

A probability that data corresponding to a state 'i' is programmed in one multi-bit cell may be denoted as P(i).

When the data corresponding to the state 'i' is programmed in the one multi-bit cell, a probability that the data corresponding to the state 'i' is determined as data corresponding to a state 'j' may be denoted as P(j|i).

A probability that the data corresponding to the state 'i' is erroneously determined as data corresponding to states having a threshold voltage less than the state 'i' although the data corresponding to the state 'i' is programmed in the one multi-bit cell may be denoted as $P_{E-}(i)$, which may be represented as $$P_{E-}(i) = \sum_{j=0}^{i-1} P(j|i) \approx P(i-1|i). \qquad \text{[Equation 1]}$$

As illustrated in FIG. 10, when it is assumed that a distance between threshold voltages which are not adjacent to each other is sufficiently great, an approximation of Equation 1 may be not acceptable.

A probability that the data corresponding to the state 'i' is erroneously determined as data corresponding to states having a threshold voltage greater than the state 'i' although the data corresponding to the state 'i' is programmed in the one multi-bit cell may be denoted as $P_{E+}(i)$, which may be represented as $$P_{E+}(i) = \sum_{j=i+1}^{15} P(j|i) \approx P(i+1|i) = P_{E-}(i+1). \qquad \text{[Equation 2]}$$

A probability that the data corresponding to the state 'i' is erroneously determined as data corresponding to states different from the state 'i' although the data corresponding to the state 'i' is programmed in the one multi-bit cell may be denoted as $P_E(i)$, which may be represented as $$P_E(i) = \sum_{\substack{j=0 \\ j \neq i}}^{15} P(j|i) \approx P(i-1|i) + P(i+1|i) = P_{E-}(i) + P_{E+}(i). \qquad \text{[Equation 3]}$$

According to example embodiments, it may be assumed that the second control unit 120 assigns the threshold voltage states 1001 to 1016 (state '0' to state '15') to data using a modified binary code scheme pertaining to a gray code.

A process where the second control unit 120 may assign the threshold voltage states 1001 to 1016 (state '0' to state '15') to the data may be given by

TABLE 1

| | State | | | | | | | | | | | | | | | |
|---|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 | 15 |
| Page 1 | 1 | 1 | 1 | 1 | 1 | 1 | 1 | 1 | 0 | 0 | 0 | 0 | 0 | 0 | 0 | 0 |
| Page 2 | 1 | 1 | 1 | 1 | 0 | 0 | 0 | 0 | 0 | 0 | 0 | 0 | 1 | 1 | 1 | 1 |
| Page 3 | 1 | 1 | 0 | 0 | 0 | 0 | 1 | 1 | 1 | 1 | 0 | 0 | 0 | 0 | 1 | 1 |
| Page 4 | 1 | 0 | 0 | 1 | 1 | 0 | 0 | 1 | 1 | 0 | 0 | 1 | 1 | 0 | 0 | 1 |

A cell error rate (CER) of multi-bit cells may be denoted as $P_C$, which may be represented as Equation 4 below.

According to example embodiments, when shapes of all threshold voltage states may be the same, a probability that data corresponding to each of the states 'i' is programmed may be $1/16$.

$$P_C = \sum_{i=0}^{15}\sum_{\substack{j=0\\j\neq i}}^{15} P(i)P(j|i) = \frac{1}{16}\sum_{i=0}^{15}(P_{E-}(i)+P_{E+}(i)) \quad \text{[Equation 4]}$$

$$\left(\because P(i)=\frac{1}{16}, \sum_{\substack{j=0\\j\neq i}}^{15} P(j|i)=P_{E-}(i)+P_{E+}(i)\right).$$

When a target BER of k-th page data is denoted as $P_{B,k}$, a target BER of each of page data may satisfy Equation 5 to Equation 8, which may be represented as $$P_{B,1} = \sum_{i=0}^{7}\sum_{j=8}^{15} P(i)P(j|i) + \sum_{i=8}^{15}\sum_{j=0}^{7} P(i)P(j|i) \quad \text{[Equation 5]}$$
$$\approx \frac{1}{16}(P_{E+}(7)+P_{E-}(8)),$$

$$P_{B,2} = \sum_{i=0}^{3}\sum_{j=4}^{11} P(i)P(j|i) + \sum_{i=4}^{11}\left(\sum_{j=0}^{3} P(i)P(j|i)+\sum_{j=12}^{15} P(i)P(j|i)\right) + \quad \text{[Equation 6]}$$
$$\sum_{i=12}^{15}\sum_{j=4}^{11} P(i)P(j|i)$$
$$\approx \frac{1}{16}\{(P_{E+}(3)+P_{E-}(4))+(P_{E+}(11)+P_{E-}(12))\},$$

$$P_{B,3} \approx \frac{1}{16}\{(P_{E1}(1)+P_E(2))+(P_{E1}(5)+P_E(6))+ \quad \text{[Equation 7]}$$
$$(P_{E1}(9)+P_E(10))+(P_{E1}(13)+P_E(14))\}, \text{ and}$$

$$P_{B,4} \approx \frac{1}{16}[(P_{E+}(0)+P_{E-}(1))+(P_{E+}(2)+P_{E-}(3))+ \quad \text{[Equation 8]}$$
$$(P_{E+}(4)+P_{E-}(5))+(P_{E+}(6)+P_{E-}(7))+$$
$$(P_{E+}(8)+P_{E-}(9))+(P_{E+}(10)+P_{E-}(11))+$$
$$(P_{E+}(12)+P_{E-}(13))+(P_{E+}(14)+P_{E-}(15))].$$

According to example embodiments as illustrated in FIG. 10, it may be assumed that a distance between states '0' and '1' is sufficiently great. Accordingly, a transition probability between the states '0' and '1' may be assumed to be '0', which may be given by $(P_{E+}(0)+P_{E-}(1))=0$.

Also, according to example embodiments, it may be assumed that transition probabilities of possible transitions within k-th page data may be the same. Possible transitions within second page data may be a transition between a state '3' and a state '4', and between a state '11' and a state '12', which may be given by $P_{E+}(3)+P_{E-}(4)=P_{E+}(11)+P_{E-}(12)$.

When utilizing $P_{E+}(3)+P_{E-}(4)=P_{E+}(11)+P_{E-}(12)$ with respect to each of page data, Equation 9 to Equation 12 may be obtained, and may be represented as $$P_{E+}(7)+P_{E-}(8)=P(1), \quad \text{[Equation 9]}$$

$$P_{E+}(3)+P_{E-}(4)=P_{E+}(11)+P_{E-}(12)=P(2), \quad \text{[Equation 10]}$$

$$P_{E+}(1)+P_{E-}(2)=P_{E+}(5)+P_{E-}(6)=P_{E+}(9)+P_{E-}(10)=$$
$$P_{E+}(13)+P_{E-}(14)=P(3), \text{ and} \quad \text{[Equation 11]}$$

$$\begin{aligned}P_{E+}(2)+P_{E-}(3) &= P_{E+}(4)+P_{E-}(5) \quad \text{[Equation 12]}\\ &= P_{E+}(6)+P_{E-}(7)\\ &= P_{E+}(8)+P_{E-}(9)\\ &= P_{E+}(10)+P_{E-}(11)\\ &= P_{E+}(12)+P_{E-}(13)\\ &= P_{E+}(14)+P_{E-}(15)\\ &= P(4).\end{aligned}$$

Here, P(1), P(2), P(3), and P(4) may denote a transition probability of each of the page data.

When combining Equation 5 and Equation 9, Equation 13 may be obtained, which may be represented as $$P_{B,1}=1/16 \times P(1). \quad \text{[Equation 13]}$$

When combining Equation 6 and Equation 10, Equation 14 may be obtained, which may be represented as $$P_{B,2}=2/16 \times P(2). \quad \text{[Equation 14]}$$

When combining Equation 7 and Equation 11, Equation 15 may be obtained, which may be represented as $$P_{B,3}=4/16 \times P(3). \quad \text{[Equation 15]}$$

When combining Equation 8 and Equation 12, Equation 16 may be obtained, which may be represented as $$P_{B,4}=7/16 \times P(4). \quad \text{[Equation 16]}$$

According to example embodiments, threshold voltage states may be adjusted in such a manner that target BERs of all page programming operations are the same. In this instance, when the same target BER is denoted as X, Equation 17 may be obtained, and may be represented as $$P_{B,1}=P_{B,2}=P_{B,3}=P_{B,4}=X. \quad \text{[Equation 17]}$$

Also, according to example embodiments, the threshold voltage states may be adjusted in such a manner that a constant CER of the page 141 is maintained as $P_C$.

According to the code mapping scheme of Table 1, the CER $P_C$ may satisfy Equation 18, and may be represented as $$P_C=P_{B,1}+P_{B,2}+P_{B,3}+P_{B,4}=4X. \quad \text{[Equation 18]}$$

An adjustment coefficient β(k) of a k-th page programming operation may satisfy Equation 19 to Equation 22, which may be represented as $$\beta(1)=P(1)/P_C=4,$$ [Equation 19]

$$\beta(2)=P(2)/P_C=2,$$ [Equation 20]

$$\beta(3)=P(3)/P_C=1, \text{ and}$$ [Equation 21]

$$\beta(4)=P(4)/P_C=\frac{1}{2}.$$ [Equation 22]

The first control unit 110 may adjust a distance between threshold voltage states in such a manner that a transition probability P(k) of the k-th page programming operation may be the same as a value acquired by multiplying the CER $P_C$ by the adjustment coefficient β(k).

Figure 11:
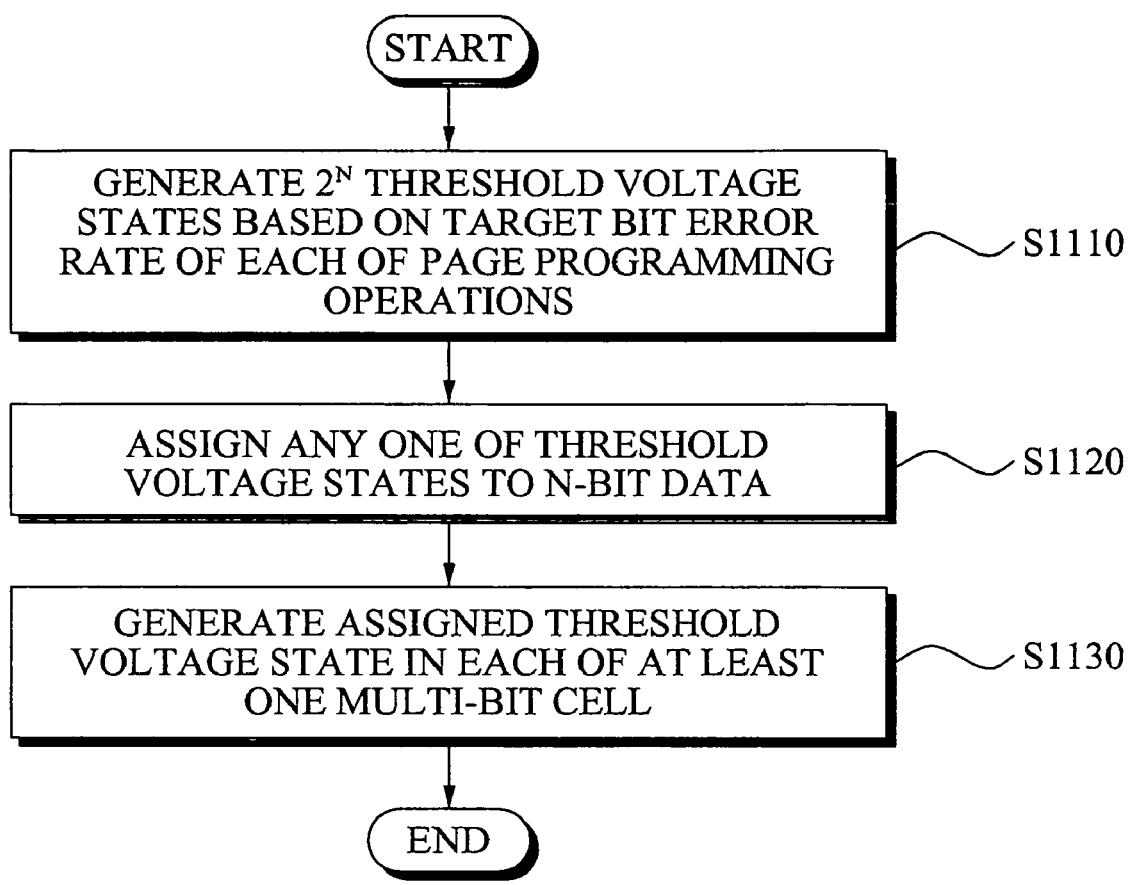
FIG. 11 is an operation flowchart illustrating a multi-bit programming method according to example embodiments.

FIG. 11 is an operation flowchart illustrating a multi-bit programming method according to example embodiments.

The multi-bit programming method may perform page programming operation N times, and programs N-bit data in each of at least one multi-bit cell.

In operation S1110, the multi-bit programming method may generate $2^N$ threshold voltage states based on a target BER of each of the page programming operations.

In operation S1120, the multi-bit programming method may assign any one of the threshold voltage states to the N-bit data.

In operation S1130, the multi-bit programming method may generate the assigned threshold voltage state in each of the at least one multi-bit cell to program the N-bit data.

According to example embodiments, the multi-bit programming method may compare the threshold voltage of the at least one multi-bit cell with a verification voltage to output the comparison result.

In this instance, operation S1130 may adjust a length of a programming time period depending on the comparison result.

In this instance, operation S1110 may adjust the verification voltage to generate threshold voltage states.

According to example embodiments, operation S1110 may estimate a BER of each of the page programming operations based on the threshold voltage states.

Operation S1110 may adjust the threshold voltage states depending on the comparison result acquired by comparing the estimated BER and the target BER.

In this instance, when the estimated BER is less than the target BER, operation S1110 may adjust, from among the threshold voltage states, threshold voltage states to be closer together associated with the estimated BER.

When the estimated BER is greater than the target BER, operation S1110 may separate the threshold voltage states associated with the estimated BER from each other by a relatively long distance, from among the threshold voltage states.

Operation S1110 may generate the threshold voltage states while maintaining a constant CER of the at least one multi-bit cell.

Operation S1110 may generate the threshold voltage states further based on a transition probability associated with each of the page programming operations.

According to example embodiments, operation S1120 may assign any one of the threshold voltage states in N-bit data using the code mapping scheme.

Operation S1110 may generate the threshold voltage states further based on the code mapping scheme.

As examples of the code mapping scheme, the binary code illustrated in FIG. 9, the modified binary code described in FIG. 4 and Table 1, and the like, may be listed.

Figure 12:
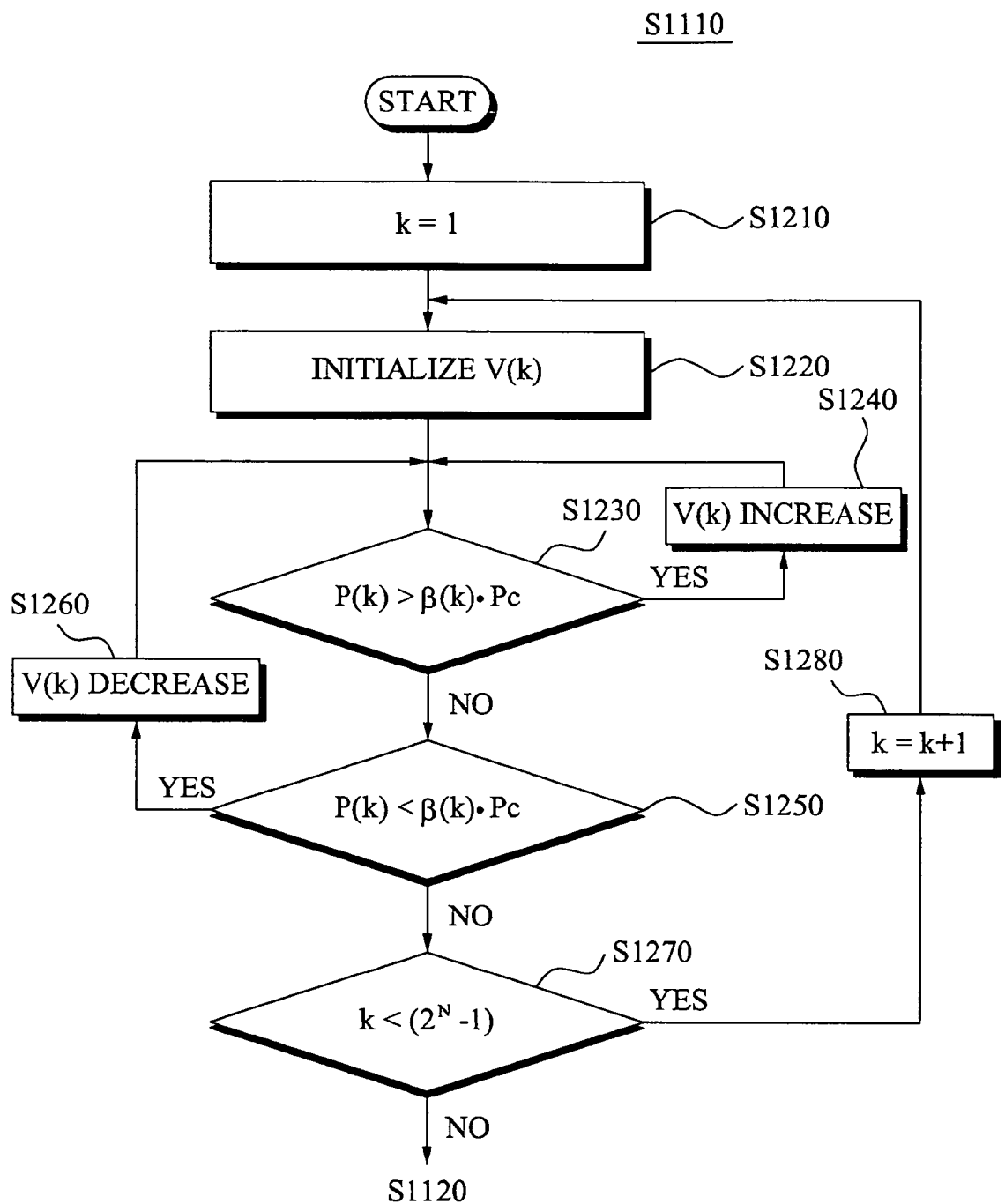
FIG. 12 is an operation flowchart illustrating an example of operation S1110 of FIG. 11 according to example embodiments.

FIG. 12 is an operation flowchart illustrating an example of operation S1110 of FIG. 11.

In FIG. 12, k may denote an index of a threshold voltage state.

In operation S1210, operation S1110 may determine k=1.

In operation S1220, operation S1110 may initialize a threshold voltage state V(k).

V(k) may have a threshold voltage greater than V(k−1) by a first voltage.

Operation S1110 may estimate the threshold voltage state V(k) and a transition probability P(k) of V(k−1).

In operation S1230, operation S1110 may determine whether the transition probability P(k) is greater than a value acquired by multiplying the CER $P_C$ and a predetermined adjustment coefficient β(k).

In operation S1240, when P(k) is greater than the value acquired by multiplying $P_C$ and β(k), operation S1110 may increase V(k) by a second voltage.

In this instance, the second voltage may be significantly less than the first voltage.

In operation S1250, operation S1110 may determine whether P(k) is less than the value acquired by multiplying $P_C$ and P(k).

In operation S1260, when P(k) is less than the value acquired by multiplying $P_C$ and β(k), operation S1110 may reduce V(k) by the second voltage.

Operation S1110 may perform operation S1230 again with respect to adjusting V(k) in operation S1240 or operation S1260.

In operation S1270, when P(k) is equal to the value acquired by multiplying $P_C$ and β(k), operation S1110 may determine whether k is less than $2^N-1$.

When k is equal to or greater than $2^N-1$ according to the determination result of the operation S1270, the multi-bit programming method may finish operation S1110 and performs operation S120.

In operation S1280, when k is less than $2^N-1$ according to the determination result of the operation S1270, the multi-bit programming method may increase k by '1'.

Operation S1110 may perform operation S1220 again with respect to k adjusted by operation S1110 in operation S1280.

The multi-bit programming method according to the above-described example embodiments may be recorded in computer-readable media which may include program instructions to implement various operations embodied by a computer. The media may also include, alone or in combination with the program instructions, data files, data structures, and the like. The media and program instructions may be those specially designed and constructed for the purposes of use according to example embodiments, or they may be of the kind well-known and available to those having skill in the computer software arts. Examples of computer-readable media may include magnetic media, for example hard disks, floppy disks, and magnetic tape; optical media, for example CD ROM disks and DVD; magneto-optical media, for example optical disks; and hardware devices that are specially configured to store and perform program instructions, for example read-only memory (ROM), random access memory (RAM), flash memory, and the like. Examples of program instructions may include both machine code, for example produced by a compiler, and files containing higher level code that may be executed by the computer using an interpreter. The described hardware devices may be configured to act as one or more software modules in order to perform the operations of example embodiments.

Utilizing example embodiments, apparatuses and/or methods that may apply a new multi-level (multi-bit) programming scheme in a multi-level cell (MLC) memory device may reduce complexity of implementing error control code (ECC) schemes in hardware, may reduce a maximum value of a bit error rate (BER) for each page, may provide apparatuses and/or methods that may equalize the BER for each page, may optimize a distribution of a threshold voltage within a voltage window, and may make all pages evenly reliable even without performing a separate method for interleaving/deinterleaving data to be programmed.

Example embodiments having thus been described, it will be obvious that the same may be varied in many ways. These variations are not to be regarded as a departure from the intended spirit and scope of example embodiments, and all such modifications as would be obvious to one skilled in the art are intended to be included within the scope of the following claims.

What is claimed is:

1. A multi-bit programming apparatus for performing N page programming operations and programming N-bit data in each of at least one multi-bit cell, the apparatus comprising:
    a first control unit for generating $2^N$ threshold voltage states based on a target bit error rate (BER) of each of the page programming operations;
    a second control unit for assigning any one of the $2^N$ threshold voltage states to the N-bit data; and
    a programming unit for programming an assigned threshold voltage state, from among the $2^N$ voltage states, in each of the at least one multi-bit cell to program the N-bit data.

2. The multi-bit programming apparatus of claim 1, further comprising:
    a comparison unit for comparing a threshold voltage of the at least one multi-bit cell with a verification voltage to output a comparison result, wherein the programming unit is configured to adjust a length of a programming time period depending on the comparison result.

3. The multi-bit programming apparatus of claim 2, wherein the first control unit is configured to adjust the verification voltage to generate the $2^N$ threshold voltage states.

4. The multi-bit programming apparatus of claim 1, wherein the first control unit includes:
    an estimation unit for estimating a BER of each of the N page programming operations based on the $2^N$ threshold voltage states; and
    an adjustment unit that adjusts at least one of the $2^N$ threshold voltage states, depending on the comparison result acquired by comparing an estimated BER with the target BER.

5. The multi-bit programming apparatus of claim 4, wherein if the estimated BER is less than the target BER, the adjustment unit is configured to adjust the at least one of the $2^N$ threshold voltage states to together at least one other threshold voltage state from among the $2^N$ threshold voltage states.

6. The multi-bit programming apparatus of claim 4, wherein if an estimated BER is greater than the target BER, the adjustment unit is configured to separate the at least one of the $2^N$ threshold voltage states from at least one other threshold voltage state from among the $2^N$ threshold voltage states.

7. The multi-bit programming apparatus of claim 1, wherein the first control unit is configured to generate threshold voltage states, from among the $2^N$ threshold voltage states, while maintaining a constant error rate of the at least one multi-bit cell.

8. The multi-bit programming apparatus of claim 1, wherein the first control unit is configured to generate threshold voltage states, from among the $2^N$ threshold voltage states, based on a transition probability associated with each of the page programming operations.

9. The multi-bit programming apparatus of claim 1, wherein the first control unit is configured to generate the threshold voltage states based on a code mapping scheme used at a time of the assignment of the $2^N$ threshold voltage states by the second control unit.

10. A multi-bit programming method for performing N page programming operations and programming N-bit data in each of at least one multi-bit cell, the method comprising:
    generating $2^N$ threshold voltage states based on a target bit error rate (BER) of each of the page programming operations;
    assigning any one of the $2^N$ threshold voltage states to the N-bit data; and
    programming the assigned threshold voltage state in each of the at least one multi-bit cell to program the N-bit data.

11. The multi-bit programming method of claim 10, further comprising:
    comparing a threshold voltage of the at least one multi-bit cell with a verification voltage to output a comparison result,
    wherein the programming of the assigned threshold voltage states adjusts a length of a programming time period depending on the comparison result.

12. The multi-bit programming method of claim 11, wherein the generating of the $2^N$ threshold voltage states adjusts the verification voltage to generate the $2^N$ threshold voltage states.

13. The multi-bit programming method of claim 10, wherein the generating of the 2.sup.N threshold voltage states includes:
    estimating a BER of each of the N page programming operations based on the threshold voltage states; and
    adjusting at least one of the $2^N$ threshold voltage states depending on a comparison result acquired by comparing the estimated BER with the target BER.

14. The multi-bit programming method of claim 13, wherein if the estimated BER is less than the target BER, the adjusting adjusts the at least one of the $2^N$ threshold voltage states to be closer to at least one other threshold voltage state from among the $2^N$ threshold voltage states.

15. The multi-bit programming method of claim 13, wherein if the estimated bit error is greater than the target BER, the adjusting includes separating the at least one of the $2^N$ threshold voltage states from at least one other threshold voltage state from among the $2^N$ threshold voltage states.

16. The multi-bit programming method of claim 10, wherein the generating of the $2^N$ threshold voltage states generates threshold voltage states, from among the $2^N$ threshold voltage states, while maintaining a constant error rate of the at least one multi-bit cell.

17. The multi-bit programming method of claim 10, wherein the generating of the $2^N$ threshold voltage states generates the threshold voltage states, from among the $2^N$ threshold voltage states, further based on a transition probability associated with each of the page programming operations.

18. The multi-bit programming method of claim 10, wherein the assigning assigns any one of the $2^N$ threshold voltage states to the N-bit data using a code mapping scheme, and the generating of the $2^N$ threshold voltage states generates the threshold voltage states, from among the $2^N$ threshold voltage states, further based on the code mapping scheme.

19. A non-transitory computer-readable recording medium storing a program for implementing the method of claims 10.

20. A multi-bit programming apparatus for performing N page programming operations and programming N-bit data in each of at least one multi-bit cell, the apparatus comprising:

a first control unit for generating $2^N$ threshold voltage states based on a target bit error rate (BER) of each of the page programming operations, at least one of the $2^N$ threshold voltage states being different from the remnant threshold voltage states of the $2^N$ threshold voltage states;

a second control unit for assigning any one of the $2^N$ threshold voltage states to the N-bit data; and a programming unit for programming an assigned threshold voltage state, from among the $2^N$ voltage states, in each of the at least one multi-bit cell to program the N-bit data and for generating a verification voltage, wherein the first control unit is configured to adjust the verification voltage by controlling the programming unit to generate the $2^N$ threshold voltage states.

\* \* \* \* \*